(12) United States Patent
Hong et al.

(10) Patent No.: US 12,159,661 B2
(45) Date of Patent: Dec. 3, 2024

(54) PIPE REGISTER CONTROL SIGNAL GENERATION CIRCUIT AND SEMICONDUCTOR APPARATUS INCLUDING THE SAME

(71) Applicant: SK hynix Inc., Icheon-si (KR)

(72) Inventors: Gi Moon Hong, Icheon-si (KR); Dae Han Kwon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 190 days.

(21) Appl. No.: 18/075,941

(22) Filed: Dec. 6, 2022

(65) Prior Publication Data

US 2023/0420038 A1  Dec. 28, 2023

(30) Foreign Application Priority Data

Jun. 28, 2022  (KR) .................. 10-2022-0079008

(51) Int. Cl.
*G11C 16/06* (2006.01)
*G11C 11/408* (2006.01)
*G11C 11/4091* (2006.01)
*G11C 11/4096* (2006.01)
*G11C 11/4099* (2006.01)

(52) U.S. Cl.
CPC ...... *G11C 11/4096* (2013.01); *G11C 11/4087* (2013.01); *G11C 11/4091* (2013.01); *G11C 11/4099* (2013.01)

(58) Field of Classification Search
CPC .................................. G11C 11/4091
USPC ..................................... 365/158.21
See application file for complete search history.

(56) References Cited

U.S. PATENT DOCUMENTS

2012/0033511 A1* 2/2012 Kim .................. G11C 7/1039
    365/189.15
2013/0286752 A1  10/2013 Michioka et al.

FOREIGN PATENT DOCUMENTS

KR    1020100131705 A    12/2010

* cited by examiner

*Primary Examiner* — Hoai V Ho
(74) *Attorney, Agent, or Firm* — WILLIAM PARK & ASSOCIATES LTD.

(57) ABSTRACT

A pipe register control signal generation circuit includes a sense amplifier configured to drive a global input/output line according to a result of sensing a voltage difference between a pair of local input/output lines according to a sense amplifier enable signal. The pipe register control signal generation circuit also includes a duplicate sense amplifier configured to simulate the sense amplifier and configured to generate a pipe register control signal according to a result of sensing a difference between a first voltage and a second voltage according to the sense amplifier enable signal.

12 Claims, 8 Drawing Sheets

PIPE REGISTER CONTROL SIGNAL GENERATION CIRCUIT AND SEMICONDUCTOR APPARATUS INCLUDING THE SAME

CROSS-REFERENCES TO RELATED APPLICATION

The present application claims priority under 35 U.S.C. § 119(a) to Korean application number 10-2022-0079008, filed on Jun. 28, 2022, in the Korean Intellectual Property Office, which is incorporated herein by reference in its entirety.

BACKGROUND

1. Technical Field

The present disclosure relates to a semiconductor circuit, and particularly, to a pipe register control signal generation circuit and a semiconductor apparatus including the same.

2. Related Art

A semiconductor apparatus receives a command, for example, a read command, on the basis of an external clock signal, performs internal signal processing on the basis of an internal clock signal, for example, a delay locked loop clock signal, and outputs the processing result.

When the frequency of the external clock signal increases for a high-speed operation of the semiconductor apparatus and a resultant high-speed operation of the semiconductor apparatus, for example, a high-speed read operation is performed, it is important to sufficiently secure an internal operation timing margin.

When the operation timing margin is not sufficiently secured, the reliability of a read operation may be reduced, which may result in degradation of the performance of the semiconductor apparatus.

The semiconductor apparatus may include a data latch circuit, for example, a pipe register, as an essential configuration for providing a pre-fetch function according to the high-speed read operation.

Because the pipe register needs to operate according to the output timing of a sense amplifier, for example, an input/output sense amplifier, timing control of a control signal for controlling the operation timing of the pipe register is very important.

SUMMARY

Various embodiments are directed to providing a pipe register control signal generation circuit capable of improving operation timing characteristics of a pipe register and a semiconductor apparatus including the same.

A pipe register control signal generation circuit in accordance with an embodiment of the present disclosure may include: a sense amplifier configured to drive a global input/output line according to a result of sensing a voltage difference between a pair of local input/output lines on the basis of a sense amplifier enable signal; and a duplicate sense amplifier configured to simulate the sense amplifier and configured to generate a pipe register control signal according to a result of sensing a difference between a first voltage and a second voltage according to the sense amplifier enable signal.

A pipe register control signal generation circuit in accordance with an embodiment of the present disclosure may include: a column decoder configured to generate a column selection signal, a dummy column selection signal, and a sense amplifier enable signal in response to a column address; a sense amplifier configured to drive a global input/output line according to a result of sensing a voltage difference between a pair of local input/output lines according to the sense amplifier enable signal; and a duplicate sense amplifier configured to simulate the sense amplifier and configured to generate a pipe register control signal according to a result of sensing a voltage difference between a pair of dummy local input/output lines according to the sense amplifier enable signal.

A semiconductor apparatus in accordance with an embodiment of the present disclosure may include: a memory bank; a sense amplifier connected to the memory bank through a pair of local input/output lines and configured to drive a global input/output line according to a result of sensing a voltage difference between the pair of local input/output lines according to a sense amplifier enable signal; a duplicate sense amplifier configured to simulate the sense amplifier and configured to generate a pipe register control signal according to a result of sensing a difference between a first voltage and a second voltage according to the sense amplifier enable signal; and a pipe register configured to pipe-process data, which are transmitted through the global input/output line, according to the pipe register control signal, and to store and output the processed data.

DETAILED DESCRIPTION

Hereinafter, embodiments of the present disclosure will be described in more detail with reference to the accompanying drawings.

Figure 1:
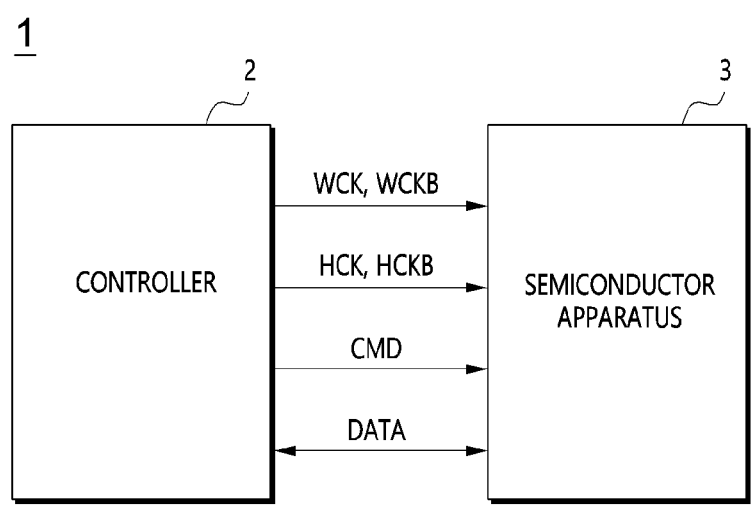
FIG. 1 is a diagram illustrating the configuration of a semiconductor system 1 in accordance with an embodiment of the present disclosure.

FIG. 1 is a diagram illustrating the configuration of a semiconductor system 1 in accordance with an embodiment of the present disclosure.

Referring to FIG. 1, the semiconductor system 1 may include a controller 2 and a semiconductor apparatus 3.

The controller 2 may be a graphic processing unit (GPU) or a central processing unit (CPU). The controller 2 may provide the semiconductor apparatus 3 with external clock signals, for example, data clock signals WCK/WCKB, system clock signals HCK/HCKB, and a command signal CMD. The data clock signals WCK/WCKB and the system clock signals HCK/HCKB may have different periods and/or frequencies. The controller 2 may provide the data clock signals WCK/WCKB to the semiconductor apparatus 3 when writing data DATA. The controller 2 may receive the data DATA outputted from the semiconductor apparatus 3 according to a read command.

The semiconductor apparatus 3 may use a multi-phase clock signal as a reference signal for a read or write operation. The semiconductor apparatus 3 may generate the multi-phase clock signal by using the external clock signals, for example, the data clock signals WCK/WCKB. The semiconductor apparatus 3 may be a volatile memory device, a nonvolatile memory device, or a memory device in which both volatile and nonvolatile memory is used.

Figure 2:
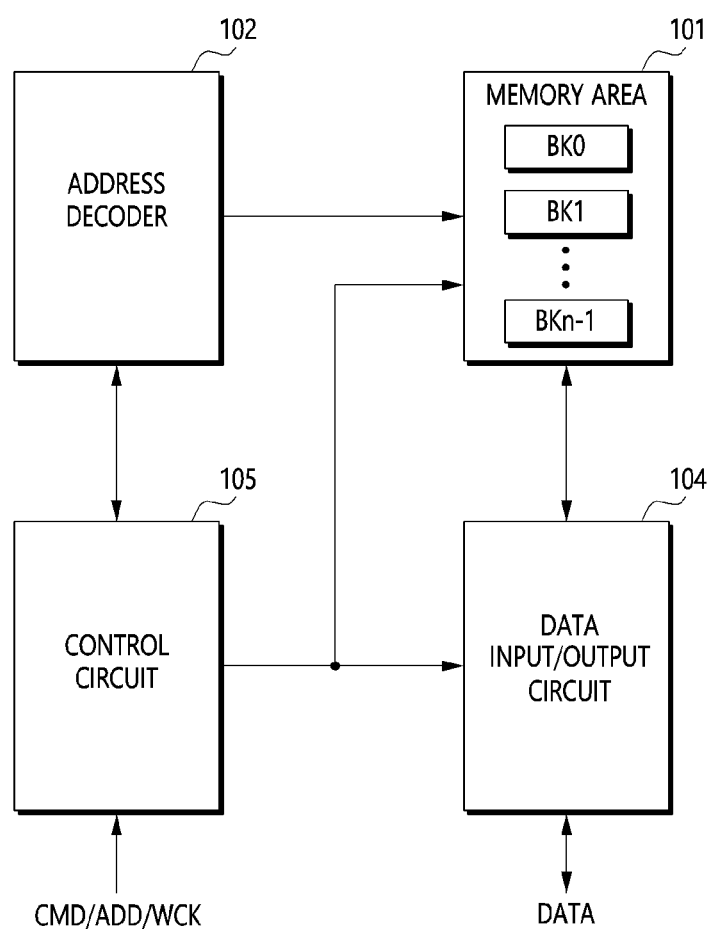
FIG. 2 is a diagram illustrating the configuration of a semiconductor apparatus 100 in accordance with an embodiment of the present disclosure.

FIG. 2 is a diagram illustrating the configuration of a semiconductor apparatus 100 in accordance with an embodiment of the present disclosure.

The semiconductor apparatus 100 may include a memory area 101, an address decoder 102, a data input/output circuit 104, and a control circuit 105.

The memory area 101 may include a plurality of memory cells, and the plurality of memory cells may represent volatile memory or nonvolatile memory. Examples of volatile memory include static RAM (SRAM), dynamic RAM (DRAM), and synchronous DRAM (SDRAM).

Examples of nonvolatile memory include read only memory (ROM), programmable ROM (PROM), electrically erasable and programmable ROM (EEPROM), electrically programmable ROM (EPROM), flash memory, phase-change RAM (PRAM), magnetic RAM (MRAM), resistive RAM (RRAM), ferroelectric RAM (FRAM), and the like. During a read operation of the semiconductor apparatus 100, data stored in the memory area 101 may be outputted, and during a write operation of the semiconductor apparatus 100, data inputted from an external system, for example, a memory controller or test equipment, may be stored in the memory area 101. Memory cells of the memory area 101 may be divided into a plurality of unit memory areas, for example, a plurality of memory banks BK0 to BKn−1.

The address decoder 102 may be connected to the control circuit 105 and the memory area 101. The address decoder 102 may decode an address signal provided from the control circuit 105 and access the memory area 101 in response to the decoding result.

The data input/output circuit 104 may be connected to the memory area 101. The data input/output circuit 104 may exchange data with an external system or the memory area 101. The data input/output circuit 104 may include a data input buffer, a data output buffer, a data input/output pad DQ, a pipe register, a test-related circuit, and the like.

The control circuit 105 may be connected to the memory area 101, the address decoder 102, and the data input/output circuit 104. The control circuit 105 may perform a test operation, a read operation, a write operation, and an address processing-related control operation of the semiconductor apparatus 100. The control circuit 105 may receive a command CMD, an address ADD, a clock signal WCK, and the like through a plurality of pads (not illustrated). The control circuit 105 may provide an address decoded through the address decoder 102 to the data input/output circuit 104.

Figure 3:
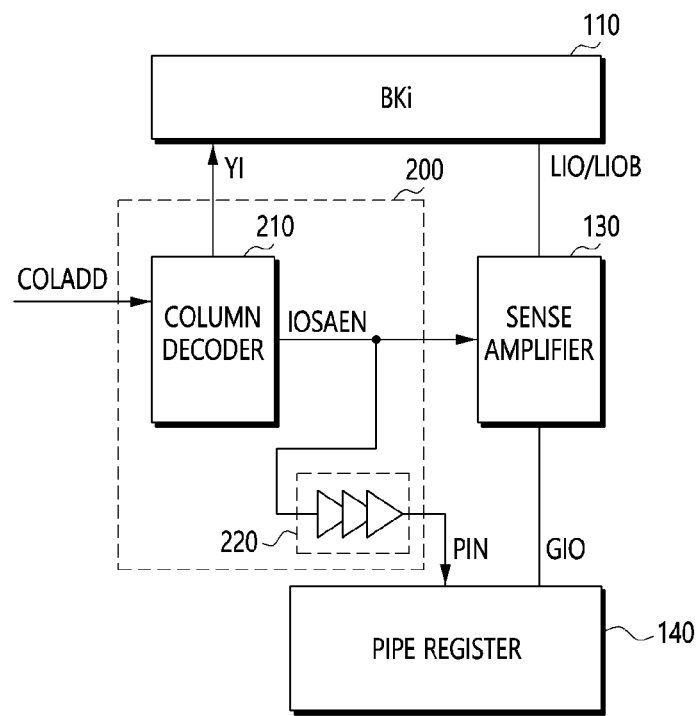
FIG. 3 is a diagram illustrating the configuration of a semiconductor apparatus including a pipe register control signal generation circuit 200 in accordance with an embodiment of the present disclosure.

FIG. 3 is a diagram illustrating the configuration of a semiconductor apparatus including a pipe register control signal generation circuit 200 in accordance with an embodiment of the present disclosure.

Referring to FIG. 3, the pipe register control signal generation circuit 200 include a column decoder 210 and a delay circuit 220.

The column decoder 210 may receive a column address COLADD and output a column selection signal YI and a sense amplifier enable signal IOSAEN. The column decoder 210 may decode the column address COLADD and activate the column selection signal YI corresponding to a value of the decoded address. The column decoder 210 may activate the sense amplifier enable signal IOSAEN with a predetermined time difference from the activation timing of the column selection signal YI.

The delay circuit 220 may receive the sense amplifier enable signal IOSAEN and output a pipe register control signal PIN. The delay circuit 220 may delay the sense amplifier enable signal IOSAEN by a set time and output the delayed signal as the pipe register control signal PIN. The delay circuit 220 may include a plurality of logic gates.

The column selection signal YI may be inputted to a memory bank BKi 110. The memory bank BKi 110 may be connected to a sense amplifier 130 through a pair of local input/output lines LIO/LIOB.

The sense amplifier 130 may be connected between the pair of local input/output lines LIO/LIOB and a global input/output line GIO. The sense amplifier 130 may be activated according to the sense amplifier enable signal IOSAEN. In response to the activation of the sense amplifier enable signal IOSAEN, the sense amplifier 130 may sense data transmitted through the local input/output lines LIO/LIOB and drive the global input/output line GIO with the detected level.

A pipe register 140 may pipe-process data, which are transmitted through the global input/output line GIO, according to the pipe register control signal PIN, and store and output the processed data.

In such a case, there occurs a time delay until the sense amplifier 130 senses the data transmitted through the local input/output lines LIO/LIOB and drives the global input/output line GIO, which is referred to as a sense amplifier delay time tD1. Accordingly, the delay circuit 220 may be designed to have a delay time corresponding to the sense amplifier delay time tD1.

Figure 4:
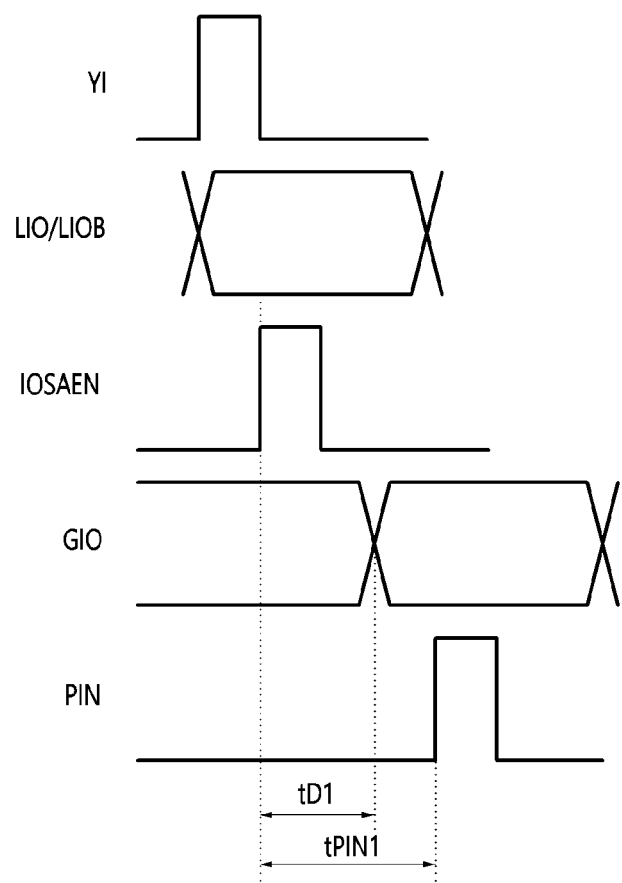
FIG. 4 is an operation timing diagram of the semiconductor apparatus in FIG. 3.

FIG. 4 is an operation timing diagram of the semiconductor apparatus in FIG. 3.

The operation of the semiconductor apparatus in accordance with an embodiment of the present disclosure configured as described above will be described with reference to FIG. 3 and FIG. 4.

During a read operation of the semiconductor apparatus, the column selection signal YI may be activated according to the column address COLADD.

Data may be outputted through the local input/output lines LIO/LIOB corresponding to the column selection signal YI being activated in the BKi 110.

The sense amplifier enable signal IOSAEN may be activated with a predetermined time difference from the activation of the column selection signal YI.

In response to the activation of the sense amplifier enable signal IOSAEN, the sense amplifier 130 may sense data transmitted through the local input/output lines LIO/LIOB and drive the global input/output line GIO with the detected level.

After the sense amplifier enable signal IOSAEN is activated and a delay time tPIN1 lapses, the pipe register control signal PIN may be activated. The pipe register 140 may pipe-process data, which are transmitted through the global input/output line GIO, according to the pipe register control signal PIN, and store and output the processed data.

Ideally, the pipe register control signal PIN needs to be delayed by the sense amplifier delay time tD1 compared to the sense amplifier enable signal IOSAEN. However, because the delay circuit 220 is configured as a plurality of logic gates and delays a signal in an asynchronous manner, the delay circuit 220 may delay the pipe register control signal PIN by the delay time tPIN1 different from a target value due to process/voltage/temperature (PVT) variations.

Figure 5:
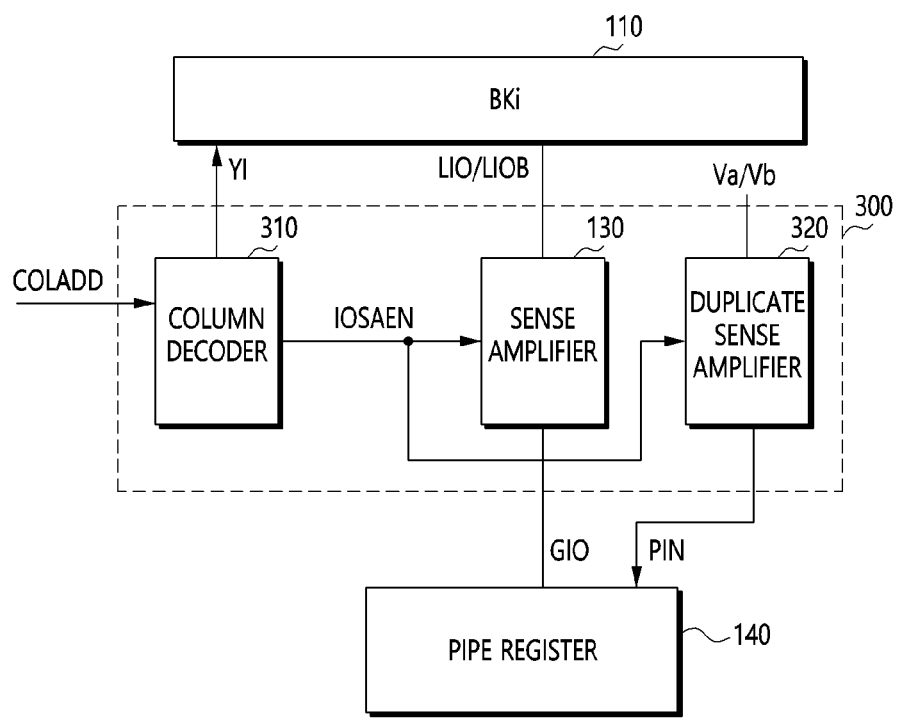
FIG. 5 is a diagram illustrating the configuration of a semiconductor apparatus including a pipe register control signal generation circuit 300 in accordance with another embodiment of the present disclosure.

FIG. 5 is a diagram illustrating the configuration of a semiconductor apparatus including a pipe register control signal generation circuit 300 in accordance with another embodiment of the present disclosure.

Referring to FIG. 5, the pipe register control signal generation circuit 300 may include a column decoder 310, the sense amplifier 130, and a duplicate sense amplifier 320.

The column decoder 310 may receive the column address COLADD and output the column selection signal YI and the sense amplifier enable signal IOSAEN. The column decoder 310 may decode the column address COLADD and activate the column selection signal YI corresponding to a value of the decoded address. The column decoder 310 may activate the sense amplifier enable signal IOSAEN with a predetermined time difference from the activation timing of the column selection signal YI.

The sense amplifier 130 may be connected between the pair of local input/output lines LIO/LIOB and the global input/output line GIO. The sense amplifier 130 may be activated according to the sense amplifier enable signal IOSAEN. In response to the activation of the sense amplifier enable signal IOSAEN, the sense amplifier 130 may sense data transmitted through the local input/output lines LIO/LIOB and drive the global input/output line GIO with the detected level.

The duplicate sense amplifier 320 may receive the sense amplifier enable signal IOSAEN, a first voltage Va, and a second voltage Vb, and output a pipe register control signal PIN. The duplicate sense amplifier 320 may be configured to simulate the sense amplifier 130, and may be configured to generate the pipe register control signal PIN according to a result of sensing the difference between the first voltage Va and the second voltage Vb on the basis of the sense amplifier enable signal IOSAEN. The first voltage Va may be higher or lower than the second voltage Vb by a predetermined level. The difference between a level of the first voltage Va and a level of the second voltage Vb may be determined within a range in which the duplicate sense amplifier 320 may generate the pipe register control signal PIN at an activation level (for example, a high level).

The duplicate sense amplifier 320 may be configured to simulate the sense amplifier 130 and activated by the sense amplifier enable signal IOSAEN in the same way as the sense amplifier 130, and may generate the pipe register control signal PIN by sensing the voltage difference between the first voltage Va and the second voltage Vb corresponding to the pair of local input/output lines LIO/LIOB. Accordingly, even though the above-described sense amplifier delay time tD1 is changed by PVT variations, the duplicate sense amplifier 320 may activate the pipe register control signal PIN after a delay time closer or substantially identical to the changed sense amplifier delay time tD1.

The column selection signal YI may be inputted to the BKi 110. The BKi 110 may be connected to the sense amplifier 130 through the pair of local input/output lines LIO/LIOB.

The pipe register 140 may pipe-process data, which are transmitted through the global input/output line GIO, according to the pipe register control signal PIN, and store and output the processed data.

Figure 6:
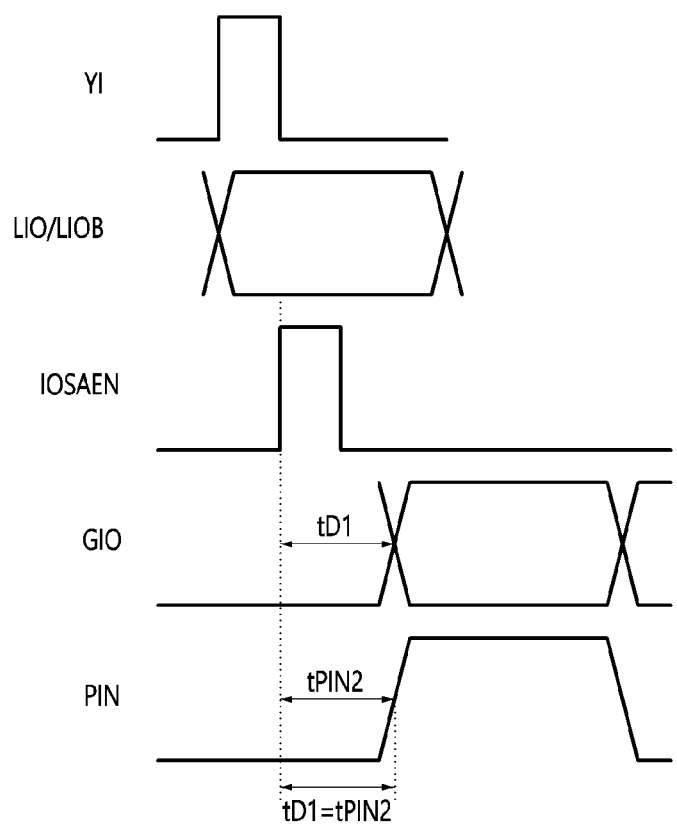
FIG. 6 is an operation timing diagram of the semiconductor apparatus in FIG. 5.

FIG. 6 is an operation timing diagram of the semiconductor apparatus in FIG. 5.

An operation of the semiconductor apparatus according to another embodiment of the present disclosure configured as described above will be described with reference to FIG. 5 and FIG. 6.

During a read operation of the semiconductor apparatus, the column selection signal YI may be activated according to the column address COLADD.

Data may be outputted through the local input/output lines LIO/LIOB corresponding to the column selection signal YI being activated in the BKi 110.

The sense amplifier enable signal IOSAEN may be activated with a predetermined time difference from the activation of the column selection signal YI.

In response to the activation of the sense amplifier enable signal IOSAEN, the sense amplifier 130 may sense data transmitted through the local input/output lines LIO/LIOB and drive the global input/output line GIO with the detected level.

In response to the activation of the sense amplifier enable signal IOSAEN, the duplicate sense amplifier 320 may sense the voltage difference between the first voltage Va and the second voltage Vb and activate the pipe register control signal PIN. In such a case, there occurs a time delay until the duplicate sense amplifier 320 senses the voltage difference between the first voltage Va and the second voltage Vb and activates the pipe register control signal PIN, which is referred to as a duplicate sense amplifier delay time tPIN2.

Even though the above-described sense amplifier delay time tD1 is changed by PVT variations, the duplicate sense amplifier 320 may activate the pipe register control signal PIN after the duplicate sense amplifier delay time tPIN2 closer or substantially identical to the changed sense amplifier delay time tD1.

The pipe register 140 may pipe-process data, which are transmitted through the global input/output line GIO, according to the pipe register control signal PIN, and store and output the processed data.

According to the above-described embodiment of the present disclosure, the timing of data transmission to the global input/output line GIO and the activation timing of the pipe register control signal PIN may better coincide with each other regardless of PVT variations. Accordingly, the operation timing characteristics of the pipe register 140 may be improved, and consequently, the operation characteristics of the semiconductor apparatus may be improved.

Figure 7:
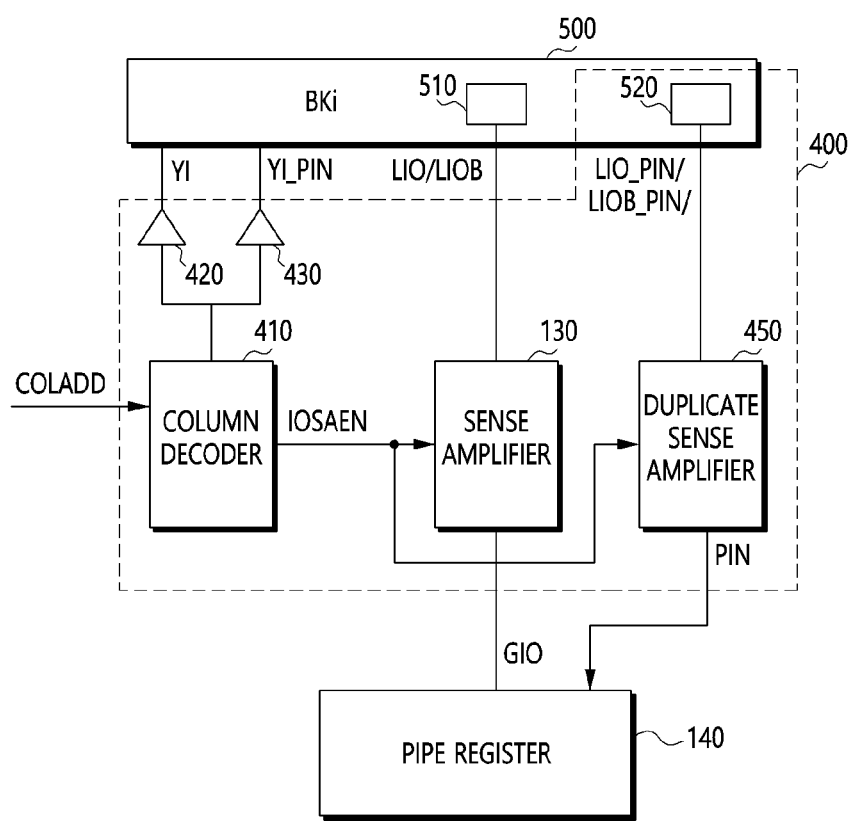
FIG. 7 is a diagram illustrating the configuration of a semiconductor apparatus including a pipe register control signal generation circuit 400 in accordance with further another embodiment of the present disclosure.

FIG. 7 is a diagram illustrating the configuration of a semiconductor apparatus including a pipe register control signal generation circuit 400 in accordance with further another embodiment of the present disclosure.

Referring to FIG. 7, the pipe register control signal generation circuit 400 may include a column decoder 410, a first driver 420, a second driver 430, the sense amplifier 130, a duplicate sense amplifier 450, a column selection circuit 510, and a dummy column selection circuit 520.

The column decoder 410 may receive the column address COLADD and output the column selection signal YI, a dummy column selection signal YI_PIN, and the sense amplifier enable signal IOSAEN. The column decoder 410 may decode the column address COLADD, duplicate a signal corresponding to a value of the decoded address through the first driver 420 and the second driver 430, and output the duplicated signals as the column selection signal YI and the dummy column selection signal YI_PIN. The column decoder 410 may activate the sense amplifier enable signal IOSAEN with a predetermined time difference from the activation timing of the column selection signal YI.

The sense amplifier 130 may be connected between the pair of local input/output lines LIO/LIOB and the global input/output line GIO. The sense amplifier 130 may be activated according to the sense amplifier enable signal IOSAEN. In response to the activation of the sense amplifier enable signal IOSAEN, the sense amplifier 130 may sense data transmitted through the local input/output lines LIO/LIOB and drive the global input/output line GIO with the detected level.

The duplicate sense amplifier 450 may receive the sense amplifier enable signal IOSAEN. The duplicate sense amplifier 450 may output the pipe register control signal PIN according to a result of sensing a voltage difference between a pair of dummy local input/output lines LIO_PIN/LIOB_PIN. The duplicate sense amplifier 450 may be configured to simulate the sense amplifier 130 and may be configured to generate the pipe register control signal PIN according to a result of sensing the voltage difference between the pair of dummy local input/output lines LIO_PIN/LIOB_PIN on the basis of the sense amplifier enable signal IOSAEN.

The column selection circuit 510 and the dummy column selection circuit 520 may be configured in a memory bank (BKi) 500. The column selection circuit 510 may be connected between bit lines and local input/output lines actually used during a read/write operation of the semiconductor apparatus. The dummy column selection circuit 520 is configured to simulate the configuration of the column selection circuit 510 so that the pair of dummy local input/output lines LIO_PIN/LIOB_PIN have substantially the same signal delay as the pair of local input/output lines LIO/LIOB, and may be formed in an extra region of the BKi 500.

The column selection circuit 510 may be connected between the pair of bit lines and the pair of local input/output lines LIO/LIOB, and may receive the column selection signal YI. The column selection circuit 510 may connect the pair of bit lines and the pair of local input/output lines LIO/LIOB in response to the column selection signal YI.

The dummy column selection circuit 520 may be configured to simulate the column selection circuit 510, and may apply a first voltage and a second voltage to the pair of dummy local input/output lines LIO_PIN/LIOB_PIN, respectively, in response to the dummy column selection signal YI_PIN.

The duplicate sense amplifier 450 may be configured to simulate the sense amplifier 130 and activated by the sense amplifier enable signal IOSAEN in the same way as the sense amplifier 130, and may generate the pipe register control signal PIN by sensing the voltage difference between the pair of dummy local input/output lines LIO_PIN/LIOB_PIN corresponding to the pair of local input/output lines LIO/LIOB. Accordingly, even though the above-described sense amplifier delay time tD1 is changed by PVT variations, the duplicate sense amplifier 450 may activate the pipe register control signal PIN after substantially the same delay time as the changed sense amplifier delay time tD1.

The pipe register 140 may pipe-process data, which are transmitted through the global input/output line GIO, according to the pipe register control signal PIN, and store and output the processed data.

Figure 8:
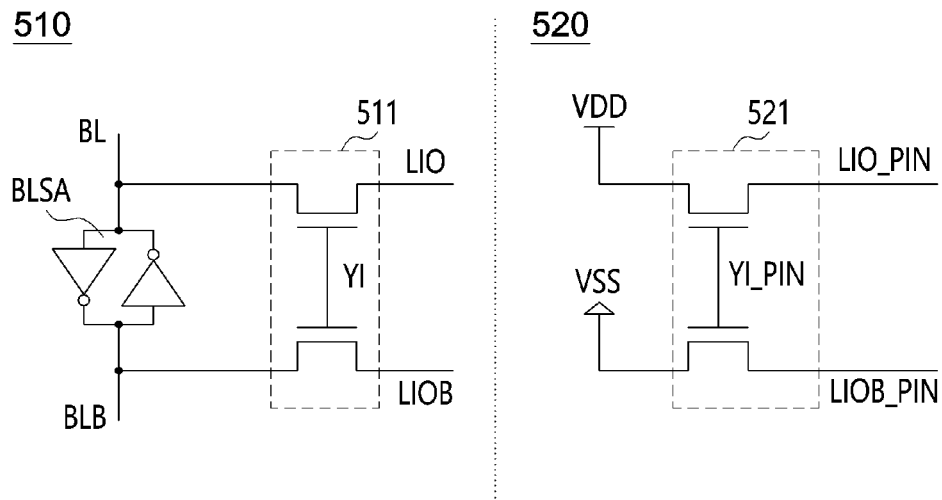
FIG. 8 is a diagram illustrating the configurations of column selection circuits 510 and 520 in FIG. 7.

FIG. 8 is a diagram illustrating the configurations of the column selection circuits 510 and 520 in FIG. 7.

As illustrated in FIG. 8, the column selection circuit 510 may include a switch 511 connected between a pair of bit lines BL/BLB and the pair of local input/output lines LIO/LIOB. The switch 511 may connect the pair of bit lines BL/BLB and the pair of local input/output lines LIO/LIOB when the column selection signal YI is activated. A bit line sense amplifier BLSA may be connected between the bit line BL and the bit bar line BLB.

The dummy column selection circuit 520 may include a switch 521 connected between a pair of signal lines corresponding to the pair of bit lines BL/BLB and the pair of dummy local input/output lines LIO_PIN/LIOB_PIN. When the dummy column selection signal YI_PIN is activated, the switch 521 may apply the first voltage, for example, a power supply voltage VDD, to any one of the pair of dummy local input/output lines LIO_PIN/LIOB_PIN, for example, LIO_PIN, and apply the second voltage, for example, a ground voltage VSS, to LIOB_PIN.

Figure 9:
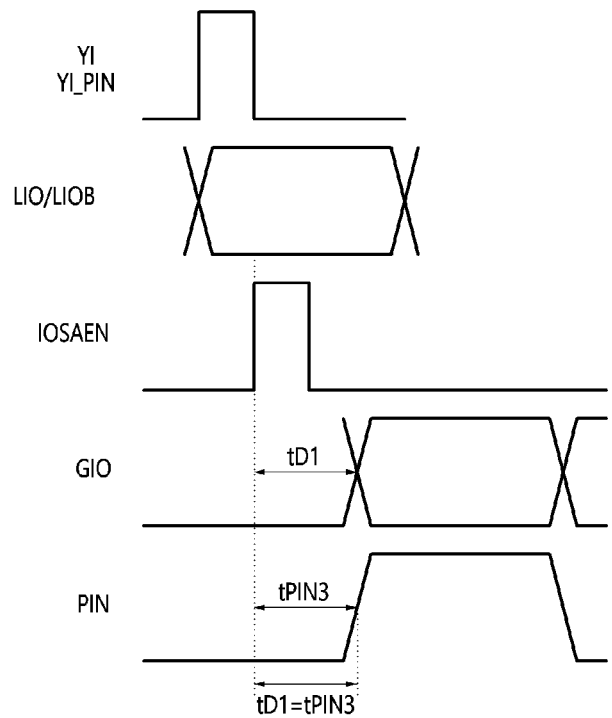
FIG. 9 is an operation timing diagram of the semiconductor apparatus in FIG. 7.

FIG. 9 is an operation timing diagram of the semiconductor apparatus in FIG. 7.

An operation of the semiconductor apparatus according to still another embodiment of the present disclosure configured as described above will be described with reference to FIG. 7 to FIG. 9.

During a read operation of the semiconductor apparatus, the column selection signal YI and the dummy column selection signal YI_PIN may be activated according to the column address COLADD.

The column selection circuit 510 of the BKi 500 may connect the pair of bit lines BL/BLB and the local input/output lines LIO/LIOB in response to the activated column selection signal YI. Data may be outputted to the sense amplifier 130 through the local input/output lines LIO/LIOB. The dummy column selection circuit 520 may apply the first voltage VDD and the second voltage VSS to the duplicate sense amplifier 450 through the pair of dummy local input/output lines LIO_PIN/LIOB_PIN in response to the activated dummy column selection signal YI_PIN.

The sense amplifier enable signal IOSAEN may be activated with a predetermined time difference from the activation of the column selection signal YI.

In response to the activation of the sense amplifier enable signal IOSAEN, the sense amplifier 130 may sense data transmitted through the local input/output lines LIO/LIOB and drive the global input/output line GIO with the detected level.

In response to the activation of the sense amplifier enable signal IOSAEN, the duplicate sense amplifier 450 may sense the voltage difference between the first voltage VDD and the second voltage VSS and activate the pipe register control signal PIN. In such a case, there occurs a time delay until the duplicate sense amplifier 450 senses the voltage difference between the first voltage VDD and the second voltage VSS and activates the pipe register control signal PIN, which is referred to as a duplicate sense amplifier delay time tPIN3.

Even though the above-described sense amplifier delay time tD1 is changed by PVT variations, the duplicate sense amplifier 450 may activate the pipe register control signal PIN after the duplicate sense amplifier delay time tPIN3 closer or substantially identical to the changed sense amplifier delay time tD1.

The pipe register 140 may pipe-process data, which are transmitted through the global input/output line GIO, according to the pipe register control signal PIN, and store and output the processed data.

According to the above-described embodiment of the present disclosure, the timing of data transmission to the global input/output line GIO and the activation timing of the pipe register control signal PIN may better coincide with each other regardless of PVT variations. Accordingly, the operation timing characteristics of the pipe register 140 may be improved, and consequently, the operation characteristics of the semiconductor apparatus may be improved. Particularly, the pipe register control signal PIN may be generated through the pair of dummy local input/output lines LIO_PIN/LIOB_PIN configured to simulate the local input/output lines LIO/LIOB and the duplicate sense amplifier 450 configured to simulate the sense amplifier 130. Therefore, a change in timing, at which data is transmitted to the global input/output line GIO, due to PVT variations may be compensated more accurately.

A person skilled in the art to which the present disclosure pertains can understand that the present disclosure may be carried out in other specific forms without changing its technical spirit or essential features. Therefore, it should be understood that the embodiments described above are illustrative in all respects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A pipe register control signal generation circuit comprising:
    a sense amplifier configured to drive a global input/output line according to a result of sensing a voltage difference between a pair of local input/output lines on the basis of a sense amplifier enable signal; and
    a duplicate sense amplifier configured to simulate the sense amplifier and configured to generate a pipe register control signal according to a result of sensing a difference between a first voltage and a second voltage according to the sense amplifier enable signal.

2. The pipe register control signal generation circuit according to claim 1, further comprising:
    a column decoder configured to generate a column selection signal and the sense amplifier enable signal in response to a column address.

3. The pipe register control signal generation circuit according to claim 1, wherein the first voltage is generated to have a level higher or lower than the second voltage by a predetermined level, and a difference between a level of the first voltage and a level of the second voltage is determined within a range in which the duplicate sense amplifier is able to generate the pipe register control signal at an activation level.

4. A pipe register control signal generation circuit comprising:
    a column decoder configured to generate a column selection signal, a dummy column selection signal, and a sense amplifier enable signal in response to a column address;
    a sense amplifier configured to drive a global input/output line according to a result of sensing a voltage difference between a pair of local input/output lines on the basis of the sense amplifier enable signal; and
    a duplicate sense amplifier configured to simulate the sense amplifier and configured to generate a pipe register control signal according to a result of sensing a voltage difference between a pair of dummy local input/output lines according to the sense amplifier enable signal.

5. The pipe register control signal generation circuit according to claim 4, further comprising:
    a dummy column selection circuit configured to apply a first voltage to any one of the pair of dummy local input/output lines in response to the dummy column selection signal, and to apply a second voltage to the other one of the pair of dummy local input/output lines.

6. The pipe register control signal generation circuit according to claim 4, wherein the column decoder is configured to decode the column address, to duplicate a signal corresponding to a value of the decoded address through a first driver and a second driver, and to output the duplicate signals as the column selection signal and the dummy column selection signal.

7. A semiconductor apparatus comprising:
    a memory bank;
    a sense amplifier connected to the memory bank through a pair of local input/output lines and configured to drive a global input/output line according to a result of sensing a voltage difference between the pair of local input/output lines on the basis of a sense amplifier enable signal;
    a duplicate sense amplifier configured to simulate the sense amplifier and configured to generate a pipe register control signal according to a result of sensing a difference between a first voltage and a second voltage according to the sense amplifier enable signal; and
    a pipe register configured to pipe-process data, which are transmitted through the global input/output line, according to the pipe register control signal, and to store and output the processed data.

8. The semiconductor apparatus according to claim 7, further comprising:
    a column decoder configured to generate a column selection signal and the sense amplifier enable signal in response to a column address.

9. The semiconductor apparatus according to claim 7, further comprising:
    a column decoder configured to generate a column selection signal, a dummy column selection signal, and the sense amplifier enable signal in response to a column address.

10. The semiconductor apparatus according to claim 9, wherein the column decoder is configured to decode the column address, to duplicate a signal corresponding to a value of the decoded address through a first driver and a second driver, and to output the duplicate signals as the column selection signal and the dummy column selection signal.

11. The semiconductor apparatus according to claim 9, wherein the duplicate sense amplifier is connected to the memory bank through a pair of dummy local input/output lines and is configured to generate the pipe register control signal according to a result of sensing a voltage difference between the first voltage and the second voltage, which are applied through the pair of dummy local input/output lines, according to the sense amplifier enable signal.

12. The semiconductor apparatus according to claim 9, further comprising:
- a dummy column selection circuit included in the memory bank and configured to apply the first voltage to any one of a pair of dummy local input/output lines in response to the dummy column selection signal, and to apply the second voltage to the other one of the pair of dummy local input/output lines.

* * * * *